(12) United States Patent
Goktepeli

(10) Patent No.: US 7,157,355 B2
(45) Date of Patent: Jan. 2, 2007

(54) METHOD OF MAKING A SEMICONDUCTOR DEVICE HAVING A STRAINED SEMICONDUCTOR LAYER

(75) Inventor: Sinan Goktepeli, Austin, TX (US)

(73) Assignee: Freescale Smeiconductor, Inc., Austin, TX (US)

( * ) Notice: Subject to any disclaimer, the term of this patent is extended or adjusted under 35 U.S.C. 154(b) by 147 days.

(21) Appl. No.: 10/880,685

(22) Filed: Jun. 30, 2004

(65) Prior Publication Data

US 2006/0003561 A1 Jan. 5, 2006

(51) Int. Cl.
*H01L 21/20* (2006.01)
*H01L 21/36* (2006.01)

(52) U.S. Cl. ..................... 438/486; 438/938
(58) Field of Classification Search ............. 438/938, 438/486, 528, 289, 308
See application file for complete search history.

(56) References Cited

U.S. PATENT DOCUMENTS

| | | | |
|---|---|---|---|
| 5,426,069 A | 6/1995 | Selvakumar et al. | |
| 5,792,679 A | 8/1998 | Nakato | |
| 6,380,044 B1 * | 4/2002 | Talwar et al. | 438/308 |
| 6,825,102 B1 * | 11/2004 | Bedell et al. | 438/486 |
| 6,906,393 B1 * | 6/2005 | Sayama et al. | 257/414 |
| 2004/0018701 A1 * | 1/2004 | Ueda | 438/518 |
| 2004/0221792 A1 * | 11/2004 | Forbes | 117/4 |

FOREIGN PATENT DOCUMENTS

| | | |
|---|---|---|
| WO | WO 03/012844 A1 | 3/2003 |
| WO | WO 03/075357 A1 | 9/2003 |

OTHER PUBLICATIONS

X. Lu and N.W. Chang, "SiGe and SiGeC Surface Allow Formation Using High-dose Implantation and Solid Phase Epitaxy," 1997 IEEE, pp. 686-689, vol. 0-7803-3289-X/97.

* cited by examiner

*Primary Examiner*—Carl Whitehead, Jr.
*Assistant Examiner*—Heather Doty
(74) *Attorney, Agent, or Firm*—James L. Clingan, Jr.; Joanna G. Chiu

(57) ABSTRACT

An implant is performed in the P channel regions, while masking the N channel regions, to deeply amorphize a layer at the surface of a semiconductor layer. After this amphorization step, germanium is implanted into the amorphized layer. The germanium is implanted to a depth that is less than the amorphization depth. This germanium-doped layer that is amorphous is heated so that it is recrystallized. The recrystallization results in a semiconductor layer that is silicon germanium (SiGe) and compressive. P channel transistors are then formed in this recrystallized semiconductor layer. This process can also be applied to the N channel side while masking the P channel side. In such case the implant would preferably be carbon instead of germanium.

20 Claims, 2 Drawing Sheets

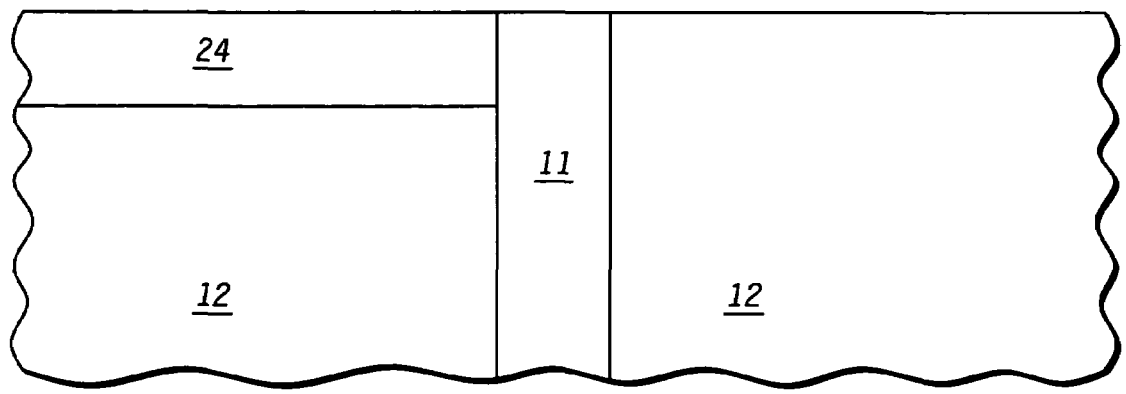
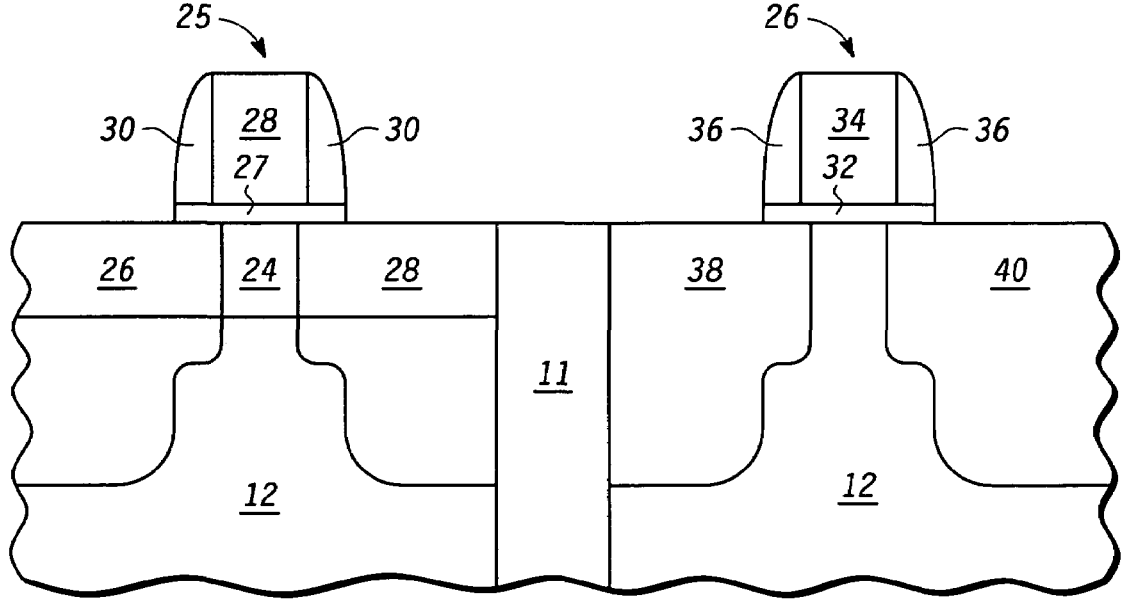

METHOD OF MAKING A SEMICONDUCTOR DEVICE HAVING A STRAINED SEMICONDUCTOR LAYER

FIELD OF THE INVENTION

This invention relates to semiconductor devices, and more particularly, to a semiconductor device structure using a strained semiconductor layer to enhance performance of transistors formed in that strained semiconductor layer.

RELATED ART

One of the ways that is being used for improving transistor performance is by straining the semiconductor layer where the transistor is formed. In the case of P channel transistors, a desirable semiconductor layer is compressive silicon germanium (SiGe). In one case, this SiGe layer is formed by epitaxial growth on a silicon seed layer. The silicon seed layer ensures that the crystal growth is monocrystalline. With the germanium in the silicon, the SiGe is ensured of being compressive if the SiGe layer is substantially defect free. Several difficulties have been found with the typical epitaxial growth methods. One problem is controlling the thickness. Another is a reduction in surface quality. Another is that surface faceting, the unwanted <112> surface, is often seen when the epitaxial growth is done selectively. This faceting adversely affects device characteristics.

Another technique is to implant germanium into silicon to dope it with germanium and to amorphize the silicon. The amphorized germanium-doped silicon is then recrystallized to form the semiconductor layer used for transistor formation. One of the problems with this approach is that the germanium profile is graded due to channeling. The tail of the profile diffuses further during a subsequent anneal. Another problem is that the interface at the end of the implant and the silicon is the region with high defects but also the high strain. The defects have the effect of degrading the strain and thus reducing the performance enhancement of the transistors.

Thus, there is a need for a method for reducing or overcoming one or more of the problems stated above.

BRIEF DESCRIPTION OF THE DRAWINGS

The present invention is illustrated by way of example and not limited by the accompanying figures, in which like references indicate similar elements, and in which:

FIG. 3 is a cross section of the semiconductor structure of FIG. 2 at a subsequent stage in processing; and FIG. 4 is a cross section of the semiconductor structure of FIG. 3 at a subsequent stage in processing.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, an implant is performed in the P channel regions, while masking the N channel regions, to deeply amorphize a layer at the surface of a semiconductor layer. After this amphorization step, germanium is implanted into the amorphized layer. The germanium is implanted to a depth that is less than the amorphization depth. This germanium-doped layer that is amorphous is heated so that it is recrystallized. The recrystallization results in a semiconductor layer that is silicon germanium (SiGe) and compressive. P channel transistors are then formed in this recrystallized semiconductor layer. This is better understood by reference to the figures and the following description.

Figure 1:
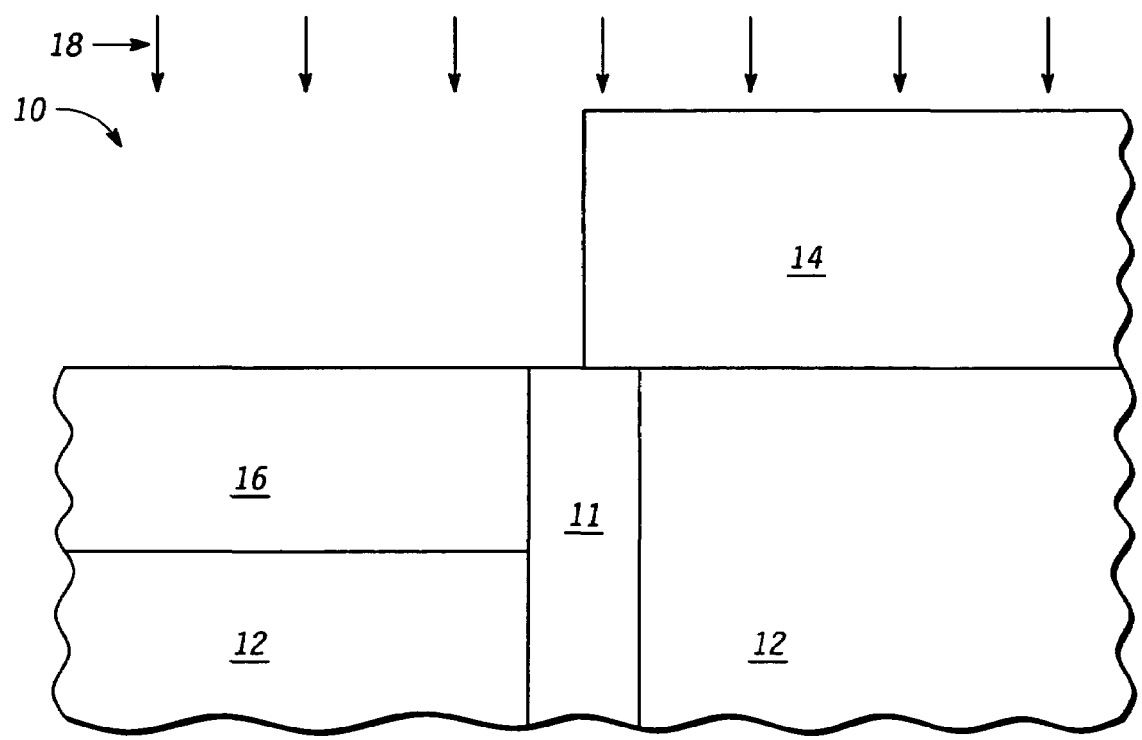
FIG. 1 is a cross section of a semiconductor structure at a first stage in processing according to an embodiment of the invention.

Shown in FIG. 1 is a semiconductor device 10 comprising semiconductor layer 12, a trench isolation region 11, an implant mask 14 over an N channel portion of layer 12, and an amorphous region 16 in a P channel portion of layer 12. Amorphous region 16 is formed by an implant 18. Semiconductor layer 12 is preferably silicon and may be, for example, bulk silicon or a top semiconductor layer of a semiconductor on insulator (SOI) substrate. The depth of amorphous region 16 is preferably about 250 Angstroms in this example, but could be a different depth. Preferably it should not exceed 400 Angstroms. This depth has been found to be achievable with an implant of xenon at an implant energy of 35 keV and a dose of $1.2 \times 10^{14}$ (1.2e14) ions per centimeter squared. Other depths could also be effective and be achieved using different energies and doses as well as a different implant species. The energy is preferably greater than 18 keV and the dose is preferably in the range of 4e13 to 4e14. Other implant species, for example, could be carbon, silicon, germanium, and argon. The dose is preferably as low as possible to still achieve the amorphization. An option is to form a sacrificial layer of oxide prior to performing implant 18 as well as before forming mask 14. This can be beneficial in protecting the surface of semiconductor layer 12 from the impact of the implant and moving the concentration peak nearer the surface, but it has the disadvantage of driving oxygen atoms into semiconductor layer 12.

Figure 2:
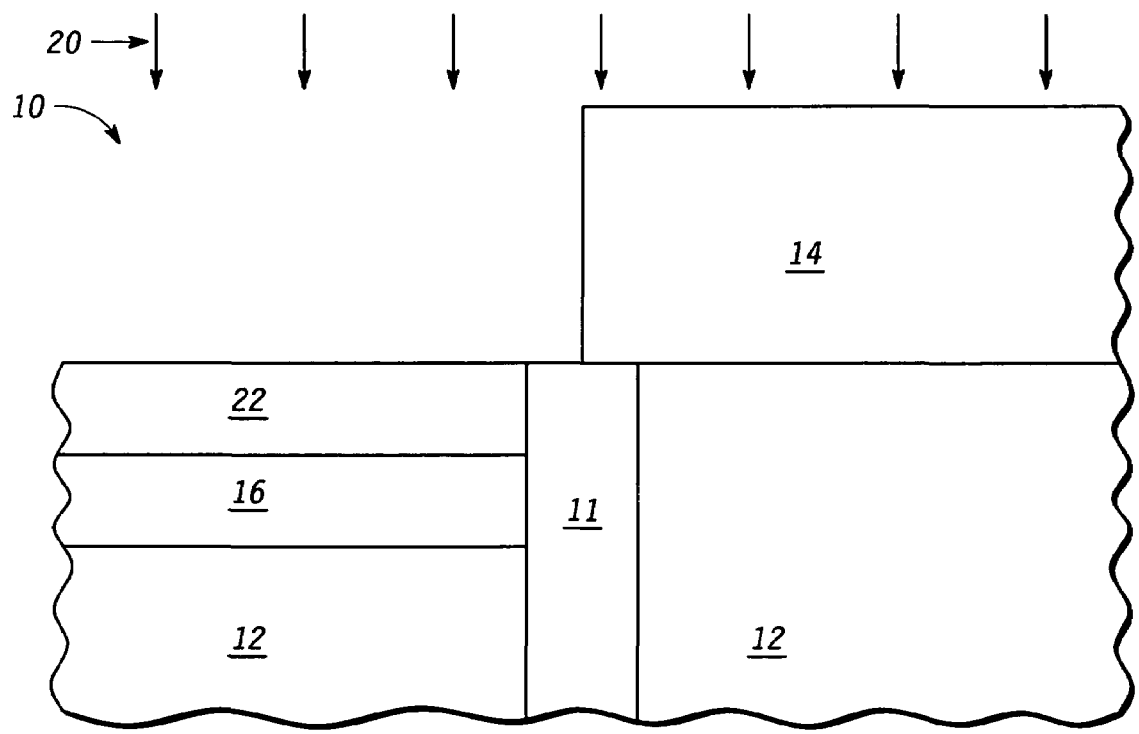
FIG. 2 is a cross section of the semiconductor structure of FIG. 1 at a subsequent stage in processing.

Shown in FIG. 2 is semiconductor device 10 after performing a germanium implant 20 that forms germanium-doped silicon region 22 in amorphous region 16. Germanium-doped silicon region 22 in this example is at a depth of about half that of amorphous region 16 and is also amorphous at this stage in processing. This implant 20 is at a much higher dose than that of implant 18. An effective implant for implant 20 has been found to be 9 keV and a dose of 1e16. The energy and dose can be adjusted to achieve the desired depth and percent of germanium. The energy is preferably less than 15 keV and the dose is preferably between 1e15 and 3e16. Preferably the bottom of layer 22 is at least 80 Angstroms above the bottom of layer 16. The region of high concentration of germanium needs to be far enough above the amorphous-monocrystalline interface to avoid a relatively high number of defects at that interface. The amount of xenon is so small that it has only a very small effect in creating defects upon crystallization.

Shown in FIG. 3 is semiconductor device 10 after an anneal step that causes amorphous region 16 to recrystallize to form a SiGe region 24 that is monocrystalline. This is in effect is a recrystallization so that the portion of region 16 below region 22 returns to be part of semiconductor layer 12. Region 22 changes from being amorphous to monocrystalline SiGe and shown as region 24. The anneal is preferably a rapid thermal anneal (RTA) spike of about 1070 degrees Celsius. Lower temperatures can also be effective in recrystalling, but preferably the temperature should be at least 900 degrees Celsius. A somewhat slower anneal has also been found to be effective. For example an RTA of 1022 degrees Celsius for ten seconds has been found to be effective in recrystallizing amorphous layer 16. If an oxide layer is formed over semiconductor layer 12 prior to implant 18 of FIG. 1, such oxide layer should be removed after the anneal. Semiconductor device 10 is now ready for transistor formation, which is preferably by conventional means, but could be by a later developed technique.

Shown in FIG. 4 is a P channel transistor 25 formed in region 24 and an N channel transistor 26 formed in semiconductor substrate 12. Transistor 25 comprises a gate dielectric 27 over region 24, a gate 28 formed over gate dielectric 27, a sidewall spacer 30 around gate 28, a source/drain region 26 on one side of gate 28 and formed in region 24, and a source/drain 28 formed on the other side of gate 28 and formed in region 24. Thus, it is seen that P channel transistor 25 is formed in a compressively stressed SiGe layer. Transistor 26 comprises a gate dielectric 32 over semiconductor layer 12, a gate 34 formed over gate dielectric 32, a sidewall spacer 36 around gate 34, a source/drain region 38 on one side of gate 34 and formed in semiconductor layer 12, and a source/drain 40 formed on the other side of gate 34 and formed in semiconductor layer 12.

This same basic approach can be used to achieve alternative strains. For example, the semiconductor layer 12 can itself be strained either as tensile or relaxed. In the example described for FIGS. 1–4, it would be preferably for semiconductor layer 12 to be tensile in order to enhance the performance of the N channel transistors. The amount of compressive stress for the P channel transistor can be adjusted by adjusting the dose of germanium that is applied.

As an alternative, the implanting steps can be applied to the N channel side while masking the P channel side. Semiconductor layer 12 in such case would preferably be compressive and perhaps SiGe suitable for forming enhanced-performance P channel transistors. The first implanting step 18 would not need to change to form the relatively deep amorphous region 16. The second implant 20 would in such case preferably be a carbon implant to form a carbon-doped region in amorphous region 16. The recrystallization of such carbon-doped region would result in a tensile stressed semiconductor layer suitable for forming performance-enhanced N channel transistors.

In all these examples, the result from the two implants and the recrystallization is a region that is strained in relation to semiconductor layer 12. This recrystallized region can even be relaxed as a result of the two implants and recrystallization if semiconductor layer 12 is under compressive or tensile stress. This approach can also be used on both the P and N channel side. After masking one side and performing the two implants and recrystallization, the other side can be masked and two implants and a recrystallization can also be performed. In such case the second implants would be of a different species.

In the foregoing specification, the invention has been described with reference to specific embodiments. However, one of ordinary skill in the art appreciates that various modifications and changes can be made without departing from the scope of the present invention as set forth in the claims below. For example, other implant species than those listed may be used. Certain thicknesses and materials were described and these may be varied. The optional sacrificial layer is described as being oxide but it could be a different material. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device, comprising:

providing a silicon substrate having a surface;

forming a sacrificial layer over the surface;

performing a first implant through the sacrificial layer to form a first implant region extending a first depth from the surface into the silicon substrate, wherein at least a portion of the silicon substrate underlies the first implant region;

performing a germanium implant through the sacrificial layer to form a germanium implant region extending a second depth from the surface into the silicon substrate, wherein the first depth extends deeper into the silicon substrate than the second depth;

recrystallizing the first implant region and the germanium implant region to form a compressive silicon germanium region at the surface of the silicon substrate;

removing the sacrificial layer after the step of recrystallizing; and forming a p-channel semiconductor device using the compressive semiconductor region, wherein the p-channel semiconductor device comprises at least a portion of the compressive silicon germanium region.

2. The method of claim 1, wherein performing the first implant comprises using a dopant selected from a group consisting of xenon, silicon, germanium, argon, carbon.

3. The method of claim 1, wherein performing the first implant comprises implanting xenon at an energy of greater than approximately 18 keV and with a dose in range of approximately $4\times10^{13}/cm^2$ to $4\times10^{14}/cm^2$.

4. The method of claim 3, wherein performing the second implant comprises implanting germanium at an energy of less than approximately 15 keV and with a dose in a range of approximately $1\times10^{15}/cm^2$ to $3\times10^{16}/cm^2$.

5. The method of claim 1, wherein performing the second implant comprises implanting germanium at an energy of less than approximately 15 keV and with a dose in a range of approximately $1\times10^{15}/cm^2$ to $3\times10^{16}/cm^2$.

6. The method of claim 1, wherein recrystallizing comprises performing a rapid thermal anneal (RTA) at a temperature of at least 900 degrees Celsius.

7. The method of claim 1, wherein the first depth extends at least approximately 80 Angstroms deeper into the silicon substrate than the second depth.

8. A method for forming a semiconductor device, comprising:

providing a semiconductor substrate having a surface, a first region, and a second region;

masking the second region;

forming a sacrificial layer over the surface;

performing a first implant through the sacrificial layer to form a first implant region extending a first depth from the surface into the first region of the semiconductor substrate to amorphize the first implant region from the first depth to the surface, wherein at least a portion of the semiconductor substrate underlies the first implant region;

performing a second implant through the sacrificial layer to form a second implant region extending a second depth from the surface into the first region of the semiconductor substrate, wherein the first depth extends deeper into the semiconductor substrate than the second depth;

recrystallizing the first implant region and the second implant region to form a strained semiconductor region at the surface of the semiconductor substrate in the first region, wherein the strained semiconductor region is strained with respect to the semiconductor substrate;

removing the sacrificial layer after the step of recrystallizing; and forming a first semiconductor device using the strained semiconductor region in the first region, wherein the first semiconductor device comprises at least a portion of the strained semiconductor region, and forming a second semiconductor device in the second region.

9. The method of claim 8, wherein the first semiconductor device is a p-channel device, the second semiconductor device is an n-channel device, and the strained semiconductor region in the first region is compressively strained.

10. The method of claim 8, wherein the first semiconductor device is an n-channel device, the second semiconductor device is a p-channel device, and the strained semiconductor region in the first region is tensile strained.

11. The method of claim 8, wherein performing the first implant comprises using a dopant selected from a group consisting of xenon, silicon, germanium, argon, carbon.

12. The method of claim 11, wherein performing the second implant comprises using a dopant selected from a group consisting of silicon, carbon, and germanium.

13. The method of claim 8, wherein performing the second implant comprises implanting germanium at an energy of less than approximately 15 keV and with a dose in a range of approximately $1 \times 10^{15}/cm^2$ to $3 \times 10^{16}/cm^2$.

14. The method of claim 8, wherein performing the second implant comprises using a dopant selected from the group consisting of silicon, carbon, and germanium.

15. The method of claim 8, wherein the strained semiconductor region extends a third depth from the surface into the semiconductor substrate, wherein the first depth extends deeper into the semiconductor substrate than the third depth.

16. The method of claim 15, wherein the third depth extends at most approximately 400 Angstroms into the semiconductor substrate.

17. The method of claim 8, wherein the semiconductor substrate comprises one of silicon, germanium, or silicon germanium.

18. The method of claim 8, wherein the strained semiconductor region is one of more relaxed or more stressed than the semiconductor substrate.

19. The method of claim 8, wherein recrystallizing comprises performing a rapid thermal anneal (RTA) at a temperature of at least 900 degrees Celsius.

20. The method of claim 8, wherein the first depth extends at least approximately 80 Angstroms deeper into the semiconductor substrate than the second depth.

* * * * *